(12) United States Patent
Parizeau et al.

(10) Patent No.: US 9,913,407 B2
(45) Date of Patent: Mar. 6, 2018

(54) ENERGY EFFICIENT VERTICAL DATA CENTER

(71) Applicant: VERT.COM INC., Montreal, Quebec (CA)

(72) Inventors: Marc Parizeau, Quebec (CA); Eric Mateu-Huon, Montreal (CA); Philippe Savard, Repentigny (CA)

(73) Assignee: VERT.COM INC., Montreal (CA)

( * ) Notice: Subject to any disclaimer, the term of this patent is extended or adjusted under 35 U.S.C. 154(b) by 35 days.

(21) Appl. No.: 15/100,960

(22) PCT Filed: Apr. 28, 2015

(86) PCT No.: PCT/CA2015/050350
§ 371 (c)(1),
(2) Date: Jun. 1, 2016

(87) PCT Pub. No.: WO2015/164961
PCT Pub. Date: Nov. 5, 2015

(65) Prior Publication Data
US 2017/0042067 A1    Feb. 9, 2017

Related U.S. Application Data

(60) Provisional application No. 61/985,301, filed on Apr. 28, 2014.

(51) Int. Cl.
*H05K 7/20* (2006.01)
*H05K 7/14* (2006.01)
(Continued)

(52) U.S. Cl.
CPC ........... *H05K 7/20745* (2013.01); *G06F 1/16* (2013.01); *G06F 1/20* (2013.01); *H05K 7/1497* (2013.01);
(Continued)

(58) Field of Classification Search
CPC ........... H05K 7/20745; H05K 7/20836; H05K 7/2079; H05K 7/1497; G06F 1/16; G06F 1/20
See application file for complete search history.

(56) References Cited

U.S. PATENT DOCUMENTS 7,630,795 B2 * 12/2009 Campbell ............... F28D 15/00
361/701
8,072,780 B1 * 12/2011 Roy ................... H05K 7/20736
361/825

(Continued)

*Primary Examiner* — Robert J Hoffberg
*Assistant Examiner* — Matt Dhillon
(74) *Attorney, Agent, or Firm* — Robert Brouillette; Brouillette Legal Inc.

(57) ABSTRACT

The vertical data center module is a multistory compact footprint data center unit that exploits vertical air movements, both downward and upward, to efficiently sustain conventional low-cost air-cooled computing systems. It integrates a hybrid cooling system that can benefit from an air-side economizer without compromising its compact footprint. For polluted urban environments, this air-side economizer comprises an air-to-air heat exchanger to effectively limit the amount of outside air that can enter the module and come into contact with sensitive computing systems. Through side-to-side, side-to-back or back-to-back juxtaposition, multiple units can be assembled in clusters on a colocation site to create large-scale vertical data center complexes, effectively maximizing real estate use and cost effectiveness by fully exploiting all three dimensions.

39 Claims, 11 Drawing Sheets

(51) Int. Cl.
*G06F 1/16* (2006.01)
*G06F 1/20* (2006.01)

(52) U.S. Cl.
CPC ....... *H05K 7/2079* (2013.01); *H05K 7/20836* (2013.01)

(56) References Cited

U.S. PATENT DOCUMENTS

| | | | | |
|---|---|---|---|---|
| 8,116,080 B2* | 2/2012 | Wormsbecher | ...... | H05K 7/1497 165/104.33 |
| 8,233,270 B2* | 7/2012 | Pierson | .............. | H05K 7/20745 345/163 |
| 8,297,067 B2* | 10/2012 | Keisling | ............ | H05K 7/20827 62/228.1 |
| 8,763,414 B2* | 7/2014 | Carlson | .................. | F25D 17/06 361/695 |
| 8,764,528 B2* | 7/2014 | Tresh | ................. | H05K 7/20745 361/691 |
| 8,931,221 B2* | 1/2015 | Somani | .................... | E04B 9/02 165/96 |
| 8,943,757 B2* | 2/2015 | Parizeau | ................. | E04H 1/005 361/694 |
| 9,374,929 B1* | 6/2016 | Meissner | ........... | H05K 7/20736 |
| 2007/0135032 A1* | 6/2007 | Wang | ........................ | F24F 9/00 454/184 |
| 2010/0048119 A1* | 2/2010 | Tashiro | .............. | H05K 7/20745 454/184 |
| 2011/0209852 A1* | 9/2011 | Enlund | .............. | H05K 7/20745 165/104.11 |
| 2014/0157692 A1* | 6/2014 | Parizeau | ................. | E04H 1/005 52/173.1 |
| 2014/0211411 A1* | 7/2014 | Slaby | ................. | H05K 7/20745 361/679.46 |
| 2015/0159389 A1* | 6/2015 | Parizeau | ................. | E04H 1/005 52/173.1 |
| 2016/0057894 A1* | 2/2016 | Chen | .................... | H05K 7/1497 361/679.47 |

* cited by examiner

ENERGY EFFICIENT VERTICAL DATA CENTER

CROSS-REFERENCE TO RELATED APPLICATIONS

The present patent application claims the benefits of priority of U.S. Provisional Patent Application No. 61/985,301, entitled "Energy Efficient Data Center" and filed at the United States Patent and Trademark Office on Apr. 28, 2014, the content of which is incorporated herein by reference.

FIELD OF THE INVENTION

The present invention generally relates to data centers and more particularly to modular data centers and data center modules.

BACKGROUND OF THE INVENTION

Modularity, scalability and flexibility are now essential requirements for efficient and cost effective data centers. Modularity is the building block that allows rapid on-demand deployment of infrastructures. Modularity minimizes capital expenditure and, thus, maximizes return on investment (ROI). Scalability relates to modularity, but is the additional key that enables a design to scale past the barrier of a predetermined fixed number of modules. It is the glue that allows the different types of modules to coherently scale: specifically computing modules with floor/space modules, power modules, and cooling modules. Flexibility further refines modularity and scalability by allowing any type of hardware from any vendor, with various power and cooling requirements, to coexist within the same data center. It is most crucial in the context of serving multiple tenants that choose to collocate their specific computing systems in a shared data center.

Recent power density increases in computer packaging are amongst the greatest limiting factors of scalability and flexibility in data centers. Current best practices suggest to partition large computing rooms into low, medium, and high power density zones. In this way, a limited form of scalability and flexibility can be reached, negating the need to overprovision the whole computing room with the highest possible power density capability. Nevertheless, forcing these zones to be sized a priori is hardly modular. The problem lies with the conventional data center design where a huge computing room is surrounded by proportionally sized mechanical and electrical rooms. Such arrangements are difficult to scale, because large distances limit the ability to efficiently distribute low voltage power to computing machinery, and move enough air to keep this machinery cool. Air cooling at large scales especially becomes daunting, because air velocity needs to be kept at acceptable levels using air conduits of limited cross-sections. Too much air velocity brings turbulence that in turn produces pressure differentials and non-uniform air distribution and poor cooling efficiency. Moving water over large distances is both much easier and efficient. However, bringing water all the way to the computer racks (or even inside the racks) creates other challenges like leak detection and proofing.

Another popular trend is to use shipping containers to host preconfigured and preassembled computing hardware. Although this approach can be very modular and, to some extent, scalable, it is not so much flexible. The physical dimensions of a standard shipping container impose severe space constraints that usually limit the computer form factors that can be hosted while rendering hardware maintenance operations more difficult. Promoters of this approach are often hardware vendors of some sort, using the container model to push their own hardware as the backbone of data centers. Container based data centers are most practical when computing resources need to be mobile for some reason. In practice, however, even though rapid initial deployment is an obvious competitive advantage, rapid redeployment is a less frequent requirement because of the relative short lifespan of computers. Moreover, there is the additional issue of the low voltage power feeds usually required by these containers that have limited space for in-container power transformation. For large-scale configurations, this forces either to inefficiently carry low voltage energy over large distances, or to combine computing containers with power transformation containers.

Energy efficiency is also a very important requirement for modern data centers, both because of its financial and environmental impact. The two main sources of power losses in data centers lie in voltage transformation and regularization, on the one hand, and heat disposal, on the second hand. Best practices for efficient electrical systems are to minimize the number of voltage transformation stages and to transport energy at higher voltage. Also, it is important to correctly size the electrical infrastructure according to effective needs, as underutilized electrical systems are usually less efficient. As for efficient heat disposal, there are mostly air-side and water-side economizers to exploit favorable outside climate conditions to totally or partially circumvent the need for power hungry mechanical chillers. The holistic problem, however, is how to design cost-effective and energy efficient data centers that are also modular, scalable, and flexible.

Finally, when considering air-side economizers, there is the additional problem of air pollution in high-density urban environments or industrial areas, where air contaminants, most notably sulfur dioxide, may produce a long-term corrosive effect on some unprotected electronic components. This issue implies that outside air must either be very well filtered or passed through air-to-air heat exchangers, in order to avoid having large amounts of air contaminant in continuous contact with computing systems.

In view of the foregoing, there is a need for an improved compact footprint data center module that mitigates at least some shortcomings of prior data center modules, and for methodology to build large-scale cost-effective data center complexes with such modules that mitigates at least some shortcomings of prior data methods to build large-scale data center.

SUMMARY OF THE INVENTION

A vertical data center module in accordance with the principles of the present invention generally mitigates at least some of the shortcomings of prior data center modules by comprising multiple levels configured to accommodate both the cooling and the electric subsystems and the computing machinery (e.g. servers), and by being configured to be deployed with other identical data center modules around a central shared facility.

A vertical data center module in accordance with the principles of the present invention generally comprises a compact-footprint weatherproof envelop, complete with party walls and staging areas, and a multistory energy efficient layout capable of powering and cooling typically generic computing hardware. The module therefore generally comprises all necessary voltage power transformation, power regularization (e.g. UPS), power distribution, and cooling subsystems. This configuration generally allows the simultaneous optimization of the power capacity density and hosting flexibility at very large scales.

In typical yet non-limitative embodiments, the vertical data center module is configured to be prefabricated and deployed in clusters of other identical (at least externally) vertical data center modules juxtaposed side-by-side, side-to-back, and/or back-to-back without interleaving between adjacent modules.

In typical yet non-limitative embodiments, the vertical data center module has a 30-feet wide footprint, e.g. the equivalent width of three shipping containers laid out side-by-side. It can accommodate different power density and cooling requirements in various redundancy configurations. It combines the advantages of the conventional "brick-and-mortar" data center with those of the container based data center, without their respective limitations. Typically using mostly standardized off-the-shelf electrical and mechanical components, it is modular and prefabricated to allow fast on-demand deployments, adding capacity in sync with user needs. It can efficiently host most any type of computing equipment with any type of power density requirement. For instance, power densities of over 30 kilowatts per cabinet are possible using air-cooled computing hardware. Cabinets that require chilled-water feeds, for instance to support rear-door heat exchangers, are also possible, even though rarely required if designed for front-to-back air circulation. Moreover, low-density cabinets can coexist side-by-side with high density ones, without creating cooling problems. For maintenance, large aisles are provided for unconstrained access to both the front and rear of compute cabinets.

Typically, a vertical module has a ground level for hosting its power and cooling subsystems, and several upper levels for hosting its computing cabinets. It is designed to be self-contained and weatherproof. Its maximum power envelope is determined by the capacity of its user specified electrical infrastructure (up to 1.2 megawatts for a typical unit). Given this infrastructure, the number of upper floors can be adjusted to match the power density requirements: less floors for higher density; more floors for lower density. The data center modules are designed to accommodate any size of air-cooled computer cabinets, as long as air circulation is front-to-back. The maximum allowable number of cabinets is a function of the cabinet width and of the number of upper levels. For instance, a 30-feet wide by 50-feet deep unit provides up to two 40-feet rows of linear space that can accommodate up to 40 standard size (24-inch wide; 20 per row) cabinets per floor (in two rows). The average allowable power dissipation per cabinet is simply determined by dividing the total power envelope of the module with its total number of cabinets. For instance, such a module with a 1.2 megawatts power envelope and three computing levels can host up to 120 cabinets, each dissipating 10 kilowatts on average. With four computing levels, 160 cabinets could be accommodated with an average power consumption of 7.5 kilowatts. The cooling system allows for any mixture of low, medium or high power density cabinets, as long as the total power load is below the power envelope of the module.

Herein, low power density typically refers to 5 kilowatts or less per cabinet, medium density typically refers to between 5 and 15 kilowatts per cabinet, and high density typically refers to more than 15 kilowatts per cabinet. However, such ranges are likely to change over time.

In accordance with the principles of the present invention, though each vertical data center module is mostly autonomous, it is configured to be deployed around a central facility responsible for providing reliable low or medium voltage power feeds that can efficiently be carried over distances of several hundreds of feet to modules, in a cost-effective and energy efficient way.

Herein, low voltage is typically defined as below 1 kilovolt, while medium voltage is typically between 1 and 30 kilovolts. The central facility typically includes the usual medium voltage power generators and transfer switchgears that provide backup energy in case of grid failure. It can also include any high-to-medium voltage transformation gear that is necessary if the utility company energizes the central facility with a high voltage power line. Herein, high voltage typically refers to above 30 kilovolts.

The central facility typically further includes high efficiency modular chilled-water production subsystems, optimized for the local climate using water towers or any other water-side economizer mechanisms. The rational for centralizing the chilled-water service revolves around the following three motivations. First, on a yearly basis, it is expected that most of the cooling necessary for a module can be realized using an air-side economizer cycle based on outside fresh air. Thus, there is no need for providing necessarily undersubscribed and inefficient local chilled-water production capacity. The air-side economizer cycle is built into the vertical data center module because, contrary to water, air cannot efficiently be carried over large distances; it needs to be handled locally. Second, large industrial chillers can be made very efficient, much more than any other direct exchange (DX) cooling system small enough to fit inside a module. If all cooling cannot be realized using an air-side economizer cycle, centralizing the chilled-water production is still an effective way of minimizing the power usage efficiency (PUE) of a data center complex. Third, if it is practical to reuse the heat generated by the computing machinery for other means, for instance to heat adjacent buildings during winter, then the chilled-water loop must also be centralized to maximize the energy reuse effectiveness (ERE) of the data center complex.

Thus, whenever practical, to enable energy reuse, the central facility can signal the modules that they should use as much chilled-water as necessary, by recycling the wasted hot air in a closed-loop, transferring the corresponding energy into the water return of the chilled-water loop. Otherwise, if no more energy reuse is possible, the modules will try to minimize the PUE by using as little chilled-water as possible, instead favoring free air cooling, breathing outside fresh air, circulating this air through computer cabinets and exhausting the wasted hot air to the outside.

Finally, the central facility is also responsible for providing other shared services, for instance points of presence for Internet providers, security check points and biometric access controls, loading docks, meeting rooms, etc.

In typical yet non-limitative embodiments, the central facility is connected to scalable clusters of vertical data center modules using segregated passage ways for power feeds, chilled-water loops, communication network cables (e.g. fiber-optic cables), and human access. Data center modules are typically juxtaposed on both sides of a multi-story corridor structure. The lower level corridor generally provides human access to the power and cooling subsystems, while the upper level corridors are for accessing the computing levels. The chilled-water loop is typically placed underground, below the lower level corridor, while the power feeds are routed in the false ceiling of the same corridor. All communication network cables are typically routed in the false ceiling of the upper level corridors.

In typical yet non-limitative embodiments, the vertical data center module comprises an efficient cooling system combining in a single hybrid system the efficiency of both air-side and water-side economizers, without multiplying the number of system components. For polluted high-density urban environments, the air-side economizer of this hybrid system integrates an air-to-air heat exchanger without compromising the module's compact footprint.

The air-side mode of operation, where the heat dissipated by the computing machinery is rejected into the atmosphere, is preferred when there is no practical way to reuse this heat, while the water-side mode of operation is used if the heat can be reused, for example to heat other nearby buildings, or when the environmental conditions are unfavorable. The system can efficiently operate partially in both modes (hybrid mode) when only part of the generated heat can be reused in a practical way.

The particular vertical, i.e. multistory, configuration of the data center module allows for cost-effective usage of a small number of large mechanical components that both increase efficiency and reliability, contrary to previous modular systems that rely on many more smaller components because of either cramped space constraints, or because forced-air circulation over long distances is too inefficient.

In one aspect of the invention, the vertical data center module comprises an outer envelope and a plurality of levels. The plurality of levels is superimposed one over the other and comprises a bottom level and at least two upper levels. The bottom level comprises a mechanical system and an electrical system. The at least two upper levels comprises a plurality of computing machines. The plurality of levels is in fluid communication thereby allowing downward and upward movements of air within the module, which comprises an air handling unit. The air handling unit is in fluid communication with the at least two upper levels, wherein each of the plurality of levels is partitioned into a first area and a second area. The first areas of the plurality of levels are in fluid communication to allow downward movements of air within the module, and the second areas of the plurality of levels are in fluid communication to allow upward movements of air within the module. The first area and the second area of the bottom level are in fluid communication to allow air moving downwardly into the first area to transfer into the second area. Computing machines are located in the second area of each of the at least two upper levels and are arranged in at least one row, and wherein the at least one row defines at least two aisles. The at least two aisles comprise at least one cold aisle located on one side of the at least one row of computing machines, the at least one cold aisle carrying cooling air toward the computing machines and comprise at least one hot aisle located on the other side of the at least one row of computing machines, the hot aisle upwardly carrying warmed air flowing out of the computing machines. The at least one hot aisle has an increasing cross-section 340 when going up from one upper level to the next upper level;

In another aspect of the present invention, the vertical data center module further comprises an air-to-air heat exchanger in fluid communication with outside air and the air handling unit, and extracting at least part of heat contained in the warmed air flowing out of the computing machines. The air-to-air heat exchanger may comprise at least one heat wheel and/or at least one thermosiphon.

In another aspect of the present invention, the vertical data center module further comprises at least one set of cooling coils is located between the first area and the second area and through which air can flow.

In another aspect of the present invention, the cooling coils is configured to receive chilled water, where at least one valve per set of cooling coils controls volume of chilled water received by the cooling coils.

In another aspect of the present invention, the cooling coils is configured to receive chilled water, where at least one valve per set of cooling coils controls volume of chilled water received by the cooling coils.

In a further aspect of the present invention, the cooling coils comprises a water input and a water output and sensors for measuring temperature of air on both sides of the coils and for measuring water temperature at the input and output of the cooling coils In another aspect of the present invention, a plurality of blowers are located inside the first area of the plurality of levels, where variable drives are used for controlling velocity of the blowers, and sensors for measuring the velocity of the blowers.

In another aspect of the present invention, the vertical data center module further comprises a plurality of sensors used for measuring differential pressures between the at least one cold-aisle and at least one hot-aisle of each upper level of the second area. The second area of the plurality of levels comprises at least one cold air plenum and at least one relative humidity and temperature sensors within the at least one cold air plenum, and at least one relative humidity and temperature sensors outside of the module. Temperature sensors are used in each of the first and second area on each of the plurality of levels, In another aspect of the present invention, a busway based power distribution system is connected to the computing machines, which have at least one separate busway per row of cabinets. The computing machines are disposed in a plurality of cabinets disposed in rows. A busway based power distribution system is connected to the cabinets of computing machines and wherein at least one distinct busway is connected to each row of cabinets. Sensors are used for measuring the busway voltage and the busway amperage.

In another aspect of the present invention, the at least one hot aisle of a top of the at least two upper levels is in fluid communication with the air handling unit to allow air moving upwardly from the second area of the top most upper level to transfer downwardly into its first area. The air handling unit comprises at least one intake vent that has motorized dampers for controlling the amount of air from outside entering the module, at least one exhaust vent that has motorized dampers for controlling the amount of air from inside exiting the module, and at least one vent that has motorized dampers for controlling the amount of air moving upwardly within the module to be recirculated with air moving downwardly within the module. Sensors are used inside the air handling unit for measuring opening of the intake, exhaust, and recirculating dampers.

In a further aspect of the present invention, an embedded controller is configured to automatically adjusts a plurality of actuators to regulate temperature and humidity according to predetermined values and data of the sensor. The actuators are configured to open at least one valve letting water flows inside the coils, and to control speed of the blowers, and to control opening and closing of dampers in the air handling unit. The sensor measures humidity, temperature and pressure. An embedded monitoring system is configured to log and displays information on the status of the data center module, where the information comprises real-time status of the data center module, historical status of the modules, and overall power usage and energy reuse effectiveness. The embedded monitoring system displays the information using a web-based interface.

In another aspect of the invention, the data center complex comprises a central facility and at least one vertical data center module in communication with the central facility, wherein the at least one vertical data center module comprises an outer envelope and a plurality of levels. The plurality of levels is superimposed one over the other and comprises a bottom level and at least two upper levels. The bottom level comprises a mechanical system and an electrical system. The at least two upper levels comprises a plurality of computing machines. The plurality of levels is in fluid communication thereby allowing downward and upward movements of air within the module. The module comprises an air handling unit and an air-to-air heat exchanger. The air handling unit being in fluid communication with the at least two upper levels, wherein each of the plurality of levels is partitioned into a first area and a second area. The first areas of the plurality of levels are in fluid communication to allow downward movements of air within the module, and wherein the second areas of the plurality of levels are in fluid communication to allow upward movements of air within the module. The first area and the second area of the bottom level are in fluid communication to allow air moving downwardly into the first area to transfer into the second area. The computing machines are located in the second area of each of the at least two upper levels. The computing machines are arranged in at least one row, and wherein the at least one row defines at least two aisles. The at least two aisles comprise at least one cold aisle located on one side of the at least one row of computing machines, the at least one cold aisle carrying cooling air toward the computing machines. The at least two aisles comprise at least one hot aisle located on the other side of the at least one row of computing machines, the hot aisle upwardly carrying warmed air flowing out of the computing machines. The at least one hot aisle has an increasing cross-section 340 when going up from one upper level to the next upper level. The air-to-air heat exchanger is in fluid communication with outside air and the air handling unit, and extracts at least part of heat contained in the warmed air flowing out of the computing machines. The complex and the modules are in communication through a network of multilevel access corridors. Each module comprises a controller and the complex comprises an embedded controller configured to interact with the controllers of the modules to optimize the overall energy efficiency of the complex. The data center complex comprises an embedded monitoring system configured to log and displays information on the status of the modules. The information also comprises real-time status of the modules, and historical status of the modules, and overall power usage and energy reuse effectiveness. The embedded monitoring system displays the information using a web-based interface.

In another aspect of the invention, a method to deploy a data center complex comprises a central facility and at least one vertical data center module, wherein the at least one vertical data center module comprises an outer envelope and a plurality of levels. The plurality of levels is superimposed one over the other and comprises a bottom level and at least two upper levels. The bottom level comprises a mechanical system and an electrical system. The at least two upper levels comprises a plurality of computing machines. The plurality of levels is in fluid communication thereby allowing downward and upward movements of air within the module. The module comprises an air handling unit and an air-to-air heat exchanger. The air handling unit is in fluid communication with the at least two upper levels, wherein each of the plurality of levels is partitioned into a first area and a second area. The first areas of the plurality of levels are in fluid communication to allow downward movements of air within the module, and the second areas of the plurality of levels are in fluid communication to allow upward movements of air within the module. The first area and the second area of the bottom level are in fluid communication to allow air moving downwardly into the first area to transfer into the second area. The computing machines are located in the second area of each of the at least two upper levels. The computing machines are arranged in at least one row, and wherein the at least one row defines at least two aisles. The at least two aisles comprise at least one cold aisle is located on one side of the at least one row of computing machines. The at least one cold aisle carries cooling air toward the computing machines. The at least two aisles comprise at least one hot aisle located on the other side of the at least one row of computing machines, the hot aisle upwardly carrying warmed air flowing out of the computing machines. The air-to-air heat exchanger is in fluid communication with outside air and the air handling unit, and extracts at least part of heat contained in the warmed air flowing out of the computing machines. The at least one hot aisle has an increasing cross-section 340 when going up from one upper level to the next upper level stacked one on top of the other and comprises a ground level and at least one upper level. The at least one upper level comprises a plurality of computing machines. The method comprises the steps for building the central facility, building a foundation for the least one data center module, and building the at least one data center module on the foundation. The method further comprises one of the following steps: building new data center modules on-demand, or building new foundations and access corridors on-demand, or building a new central facility.

Other and further aspects and advantages of the present invention will be obvious upon an understanding of the illustrative embodiments about to be described or will be indicated in the appended claims, and various advantages not referred to herein will occur to one skilled in the art upon employment of the invention in practice. The features of the present invention which are believed to be novel are set forth with particularity in the appended claims.

BRIEF DESCRIPTION OF THE DRAWINGS

The above and other aspects, features and advantages of the invention will become more readily apparent from the following description, reference being made to the accompanying drawings in which.

DETAILED DESCRIPTION OF THE PREFERRED EMBODIMENT

Novel vertical data center modules and a method of their large-scale deployment will be described hereinafter. Although the invention is described in terms of specific illustrative embodiments, it is to be understood that the embodiments described herein are by way of example only and that the scope of the invention is not intended to be limited thereby.

Figure 1:
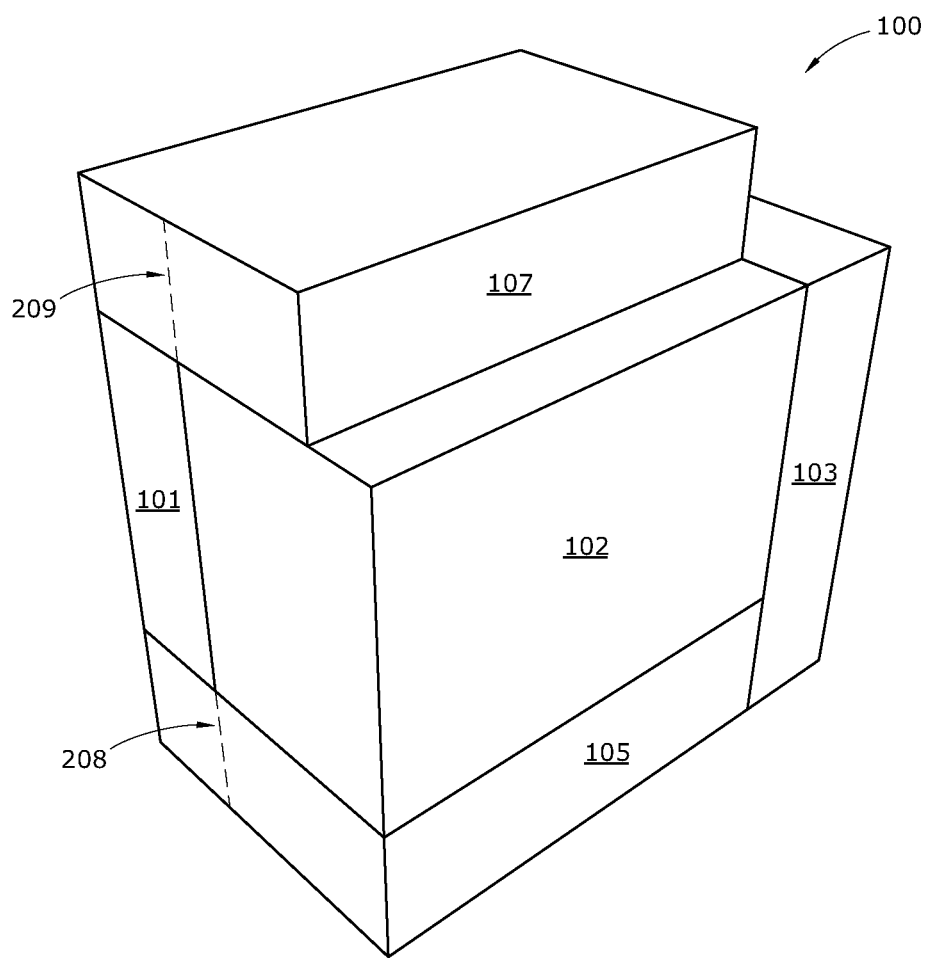
FIG. 1 presents a perspective view of the vertical data center module in accordance with the principles of the present invention, illustrating an embodiment comprising three main vertical areas in between a bottom level and a roof-top air handling unit.
Figure 2:
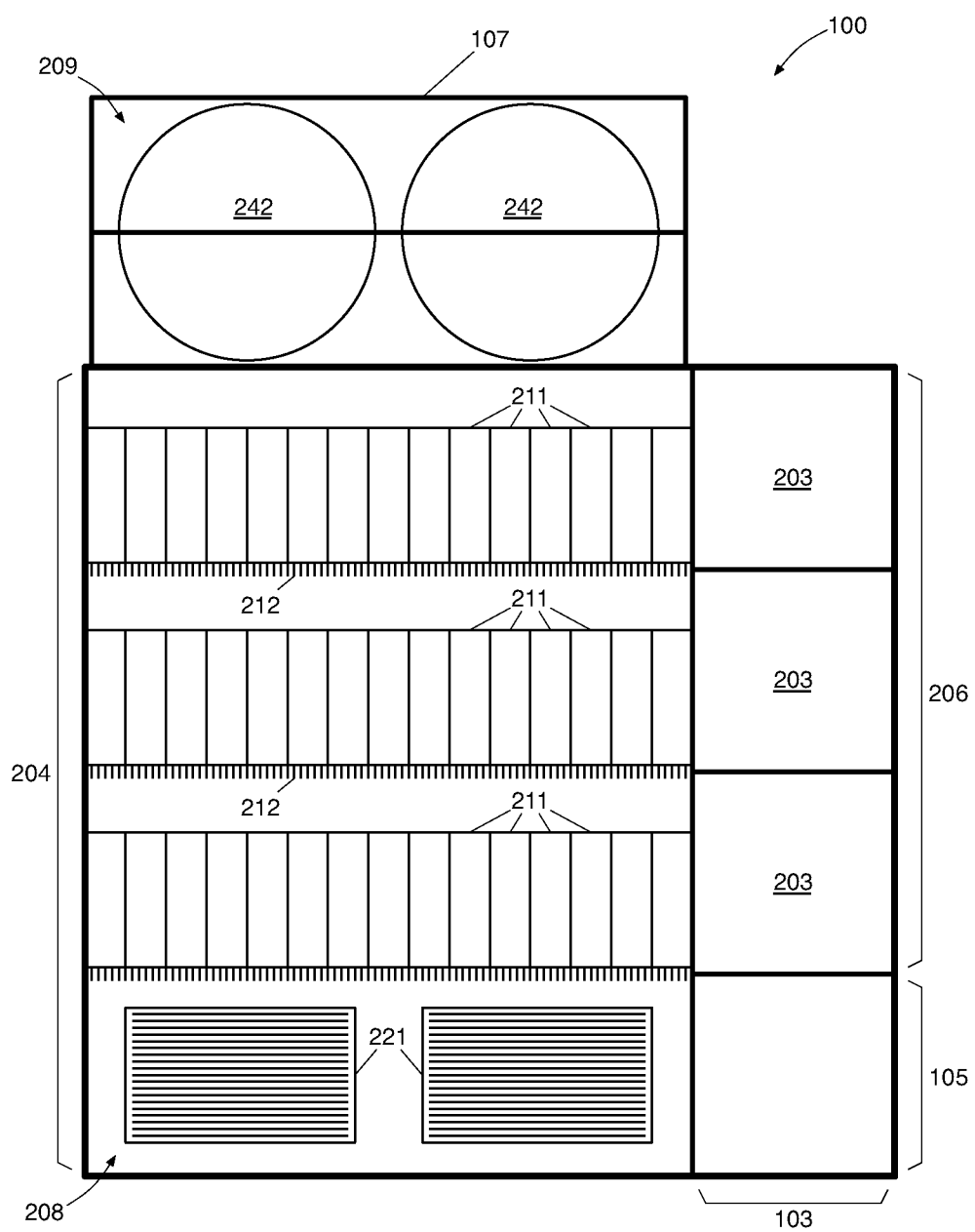
FIG. 2 shows a side sectional schematic view of a four-story embodiment of the vertical data center module in accordance with the principles of the present invention; the embodiment comprising a lower level comprising a power and cooling subsystems, three upper levels for computing machinery, and a roof-top air handling unit.

Now referring to FIG. 1 and FIG. 2, an embodiment of a vertical data center module 100 having four-story 204 is shown. The vertical data center module 100 comprises a lowest level 105 configured to receive power and cooling subsystems, three upper levels 206 configured to receive computing system cabinets 211 and a roof-top air handling unit 107.

As shown in FIG. 1, the levels above the lowest level 105 are typically divided in two distinct vertical areas. The first area 101 is adapted to allow downward air or gas fluid movements, to transfer air or gas fluid from a roof-top air handling unit 107 to a lower level 105 and to feed a main cooling system with air or other gas fluid. The second area 102 is used to host computing systems, typically organized in at least one row of racks 211. The second area 102 is configured for the air to generally move upwardly, typically from the lowest level 105 or a lower level to the roof-top air handling unit 107. A third vertical area 103 is generally configured to allow access to areas 101 and 102 on each level. In other embodiments, the third area 103 may be further configured as staging area, storage area, etc.

Still referring to FIGS. 1 and 2, on the upper levels 206, the first area 101 and the second area 102 are separated by a wall or any other mean to divide the areas. On the lower level 105, in a preferred embodiment, the separation 208 comprises one or more air temperature regulating mechanism 221, such as cooling coils. Such regulating mechanism 221 allows the control of the temperature of the airflow that cools or lowers the air temperature of the computing systems 211. Similarly, within the roof-top air handling unit 107, in a preferred embodiment, the separation 209 comprises one or more air-to-air heat exchanging mechanism 242, such as heat wheels. Sections 203, typically located within area 103, may be configured to access each level of the module, typically to provide maintenance, to stage new computing systems, to store spare parts for maintenance or any other related use. Within the area 102 of the upper levels 206, some sections of floors are typically made with gratings 212 to allow upward air movements.

Figure 3A:
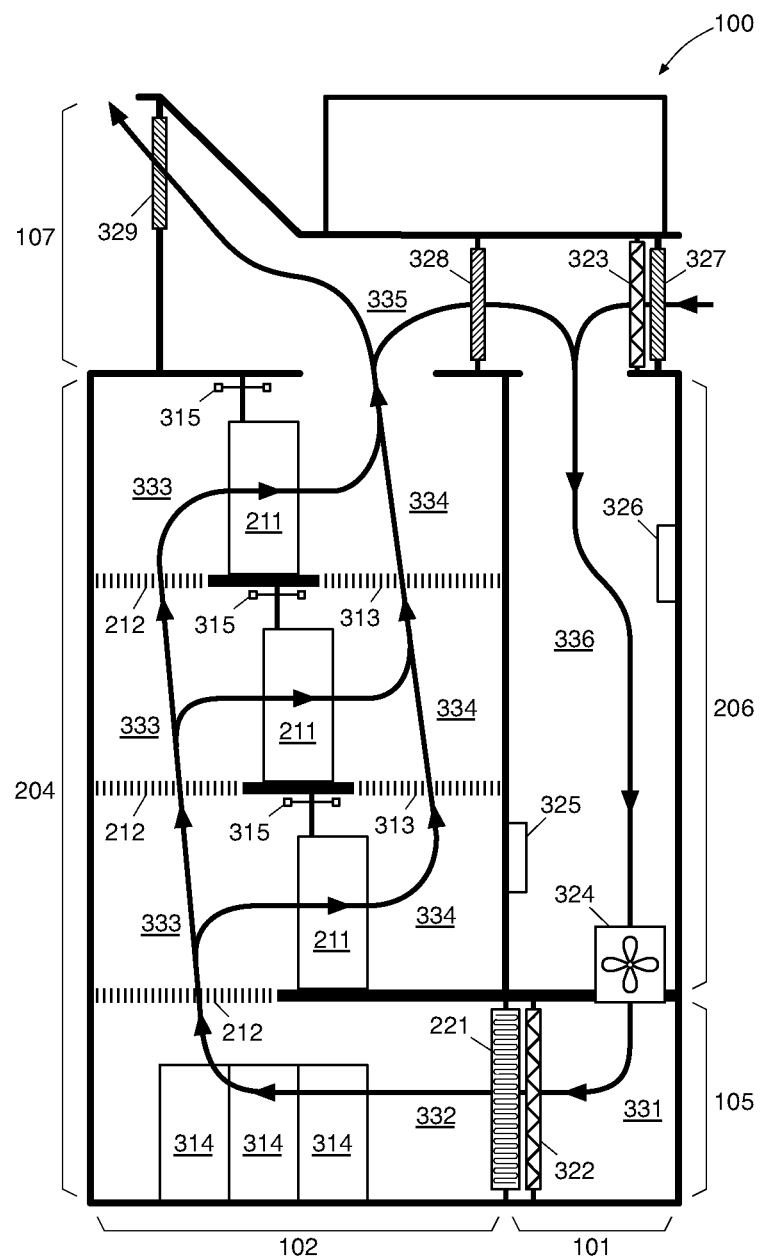
FIG. 3a is a front sectional schematic view of the four-story embodiment of FIG. 2, the embodiment using a single cabinet row per floor configuration and a basic roof-top air handling unit.

Now referring to FIG. 3a, a detailed front sectional view of an embodiment of a vertical data center module 100 having four levels 204 is shown. The vertical data center module is configured with a single row 211 of cabinets per upper level 206. In such an embodiment, the vertical data center module 100 comprises a lowest level 105 configured for receiving power and cooling subsystems, three upper levels 206 for computing systems 211, and a roof-top air handling unit 107. The vertical data center module 100 comprises at least one input plenum 331, a plurality of air displacement modules 324, such as variable drive blowers or fans, a plurality of air filtering unit 322 and 323, a plurality of air cooling module 221, one or more mixing module, typically comprising an exhaust plenum 335, one or more mixing dampers 328, and a mixing plenum 336.

Still referring to FIG. 3a, different airflows occurring in a first area 101 and in a second area 102 of the vertical data center module 100 are shown. In such an embodiment, the air flows in an input plenum 331 and through filtering 322 and cooling modules 221. The airflow is typically created from positive pressure generated by a plurality of fans or blowers, preferably embodied as variable drive blowers 324. The filtering module 322 is preferably embodied as a filter bank and the cooling module 221 as a set of cooling coils but could be embodied as any mean for cooling and filtering an airflow.

The vertical data center module 100 may be operated in different modes, typically in closed-loop operation or in a hybrid-loop operation mode. Depending on the mode of operation, the air entering the plenum 331 may be generally hot or generally cold.

In the closed-loop mode of operation, the air circulates in the hot-aisles 334 and exits from an exhaust plenum 335 through at least one mixing damper 328 to a mixing plenum 336. The air typically moves in an upwardly direction through the aisles and is warmed by the heat generated by the equipment present in the aisles. As explained above, the warm air present in the mixing plenum is downwardly moved toward the input plenum 331 where the air will be cooled by the air cooling module 221.

In the hybrid-loop mode of operation, outside air is inputted through a flow module 327, such as intake vent, and a filtering module 323, such as a plurality of filter banks. If the temperature of the outside air is cold enough, typically below 25 degrees Celsius, the cooling module 221 may be turned off completely. If the temperature of the outside air is too cold, typically below 18 degrees Celsius, the outside air must be heated by mixing it with the warm air exiting from the exhaust plenum 335. Typically, mixing modules 328 are configured to mix the two airflows to produce an airflow having the desired temperature. The airflow may also be humidified using a humidification system 326, preferably an adiabatic humidification system. In such an operation mode, the unmixed warm air present in the exhaust plenum 335 will exit the module through the exhaust vents 329. In a preferred embodiment, the air will naturally exit the plenum 335 but could be pushed by fan or other air movement control module to accelerate or to control the flow of the air exiting the vent 329.

Each level 206 typically comprises an aperture 312 between the ceiling of the lower level and the floor of the level 206 for letting the cold air move between the levels 105 and 206. Such an aperture 212 is preferably embodied as a grating. Each level comprises a cold aisle 333, a rack of devices generating heat 211 and a hot aisle 334. Each of the two upper levels further comprises a second aperture 313 between the ceiling of the lower level and the floor of the level 206 for letting the hot air move between the levels 206. The air is warmed by the passage from the cold aisle 333 through the rack 211.

Once the airflow exits the cooling modules 221 to the central plenum 332, the air may rise through the aperture 212. The air upwardly moves in the cold-aisles 333 and reaches the rack or computing systems 211. As the air goes through the cabinets 211, the air absorbs the heat dissipated by the computing systems and exits in the hot-aisles 334. Typically, the rows of cabinets 211 are disposed as to form a substantially sealed barrier between the cold-aisles 333 and hot-aisles 334. As such, the horizontal airflow is substantially concentrated through the computing systems inside the cabinets 211.

In a preferred embodiment, the airflow is concentrated through the computer systems using panels, such as lightweight filler panels installed above the cabinets 211. By substantially avoiding any mixture of cold and hot air outside of the computing cabinets 211, one should observe an increase of the efficiency of the cooling. In yet other embodiments, weather striping materials may be used in cabinets to aim at increasing the sealing by filling smaller gaps.

The air of the hot aisles 334 is free to rise through the different apertures 313 up to the exhaust plenum 335. As explained above, the air of the exhaust plenum 335 is either downwardly recirculated through the mixing module 328 and mixing plenum 336, or exhausted outside through the exhaust vents 329, depending on the modes of operation previously described. The pressure on the air present in the mixing plenum 336 is generally negative as the blowers 324 downwardly pull the air. This movement completes the airflow cycle as the air reaches the input plenum 331.

Air filtering inside the vertical data center module 100 is typically conducted in two stages. A first stage 323 using coarser filter modules to remove the larger particles from the outside air, and a second stage 322 using finer filter modules to protect the sensitive computing systems from finer contaminants.

The cooling system 221 of the vertical data center module 100 may be built from standardized industrial parts readily available and manufactured in large quantities at low cost. In a preferred embodiment, the vertical data center module comprises fans 324 providing large flow capacity and high efficiency having variable drive controllers 325 and comprises a plurality of sections of industrial multi-row coils 221. The efficiency of the industrial multi-row coils may be significantly increased as opposed to the limited efficiency of smaller coils typically found in conventional computing room air handling (CRAH) units. Moreover, the complete vertical data center module 100 may be assembled rapidly from pre-manufactured parts using well-known and mastered metal structure building techniques.

Each vertical data center module 100 typically comprises electrical subsystems 314. The electrical subsystems 314 may comprise, but are not limited to, voltage transformations, switchgear protection, and UPS, optionally in 1n, n+1 or 2n redundant configurations. The grouping of all mechanical and electrical systems in a single autonomous module may advantageously provide increase efficiency, scalability and/or flexibility.

A module operator may customize the capacity and resiliency of the module to satisfy the specific needs of users, without affecting the operations of other modules. For instance, some data center modules 100 may be operated with either no, partial, or full UPS protection, with or without redundancy. A priori decisions need not be taken for the whole data center complex, nor do power density zones need to be defined. Decisions may be postponed at the time of deployment, one module at a time, or in blocks of multiple modules.

Vertical data center modules 100 may be built on-demand. Existing data center modules 100 may also be upgraded without affecting the operations of other data center modules 100. As an example, some transformers may be upgraded to change from a 1n configuration to an n+1 configuration, or a UPS could be added, or support extended, if user's needs evolve over time.

Figure 3B:
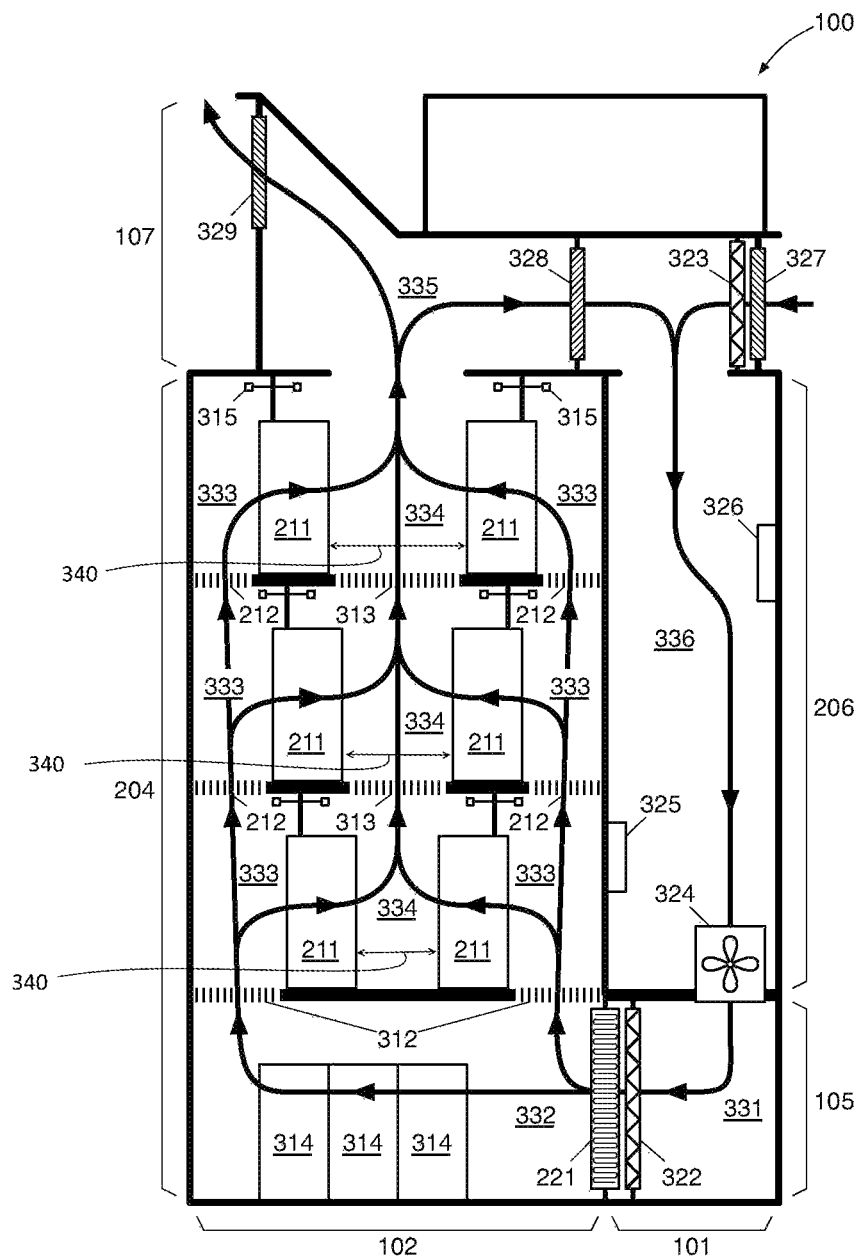
FIG. 3b is a front sectional schematic view of the four-story embodiment of FIG. 2, the embodiment using an alternate 2-row per floor configuration.

Now referring to FIG. 3b, an alternate embodiment of a four-story 204 vertical data module 100 of FIG. 3a comprising two rows of computing cabinets 211 and two cold-aisles 333 on each upper level 206 is shown. Understandably, in other embodiments, the number of cold-aisle(s), hot-aisle(s) and row(s) of computer cabinets could be different. For example, in some embodiments, there could be three cold-aisles 333, two hot-aisles 334 and four rows of cabinets 211.

Figure 3C:
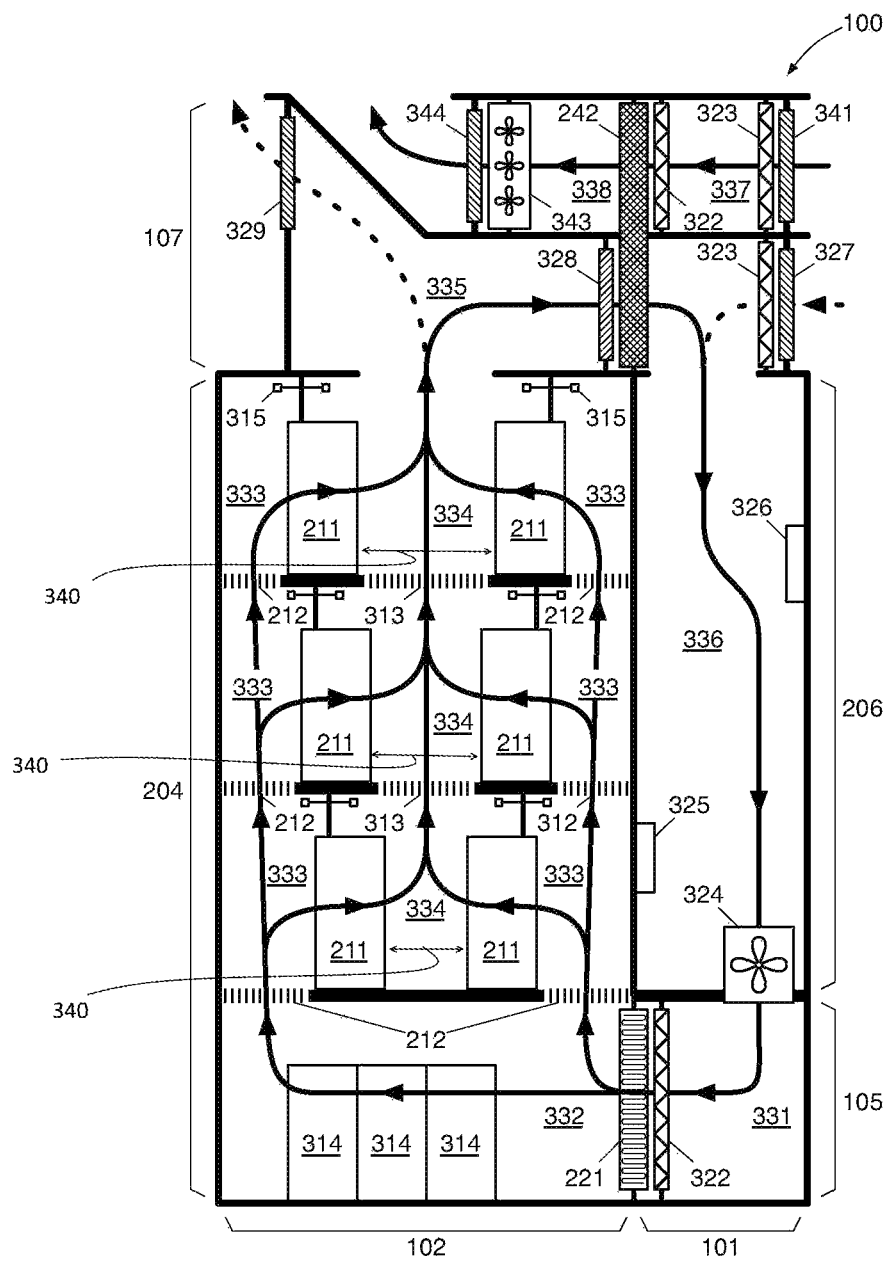
FIG. 3c is a front sectional schematic view of the four-story 2-row embodiment of FIG. 3b, the embodiment using an alternate roof-top air handling unit that comprises an air-to-air heat exchange system based on vertical heat wheels.

Now referring to FIG. 3c, another embodiment of the four-story 204 vertical data center module 100 of FIG. 3b using an alternate roof-top air handling unit 107 is shown. In such an embodiment, the roof-top air handling unit 107 comprises an air-to-air heat exchanger so that computing systems generally avoid contact with outside air. The air handling unit 107 comprises an intake vent 341, two filter banks 323 and 322, a plurality of heat wheels 242, a fan wall 343, and an exhaust vent 344. In this embodiment, the module 100 operates in closed loop mode. At least a portion of the heat contained in the airflow which circulates from the area 335 to the area 336 may be transferred to the heat wheel 242. The heat wheel 242 transfers such warm or hot air to the airflow that circulates from the area 337 to the area 338. The resulting airflow is released outside through one or more exhaust vent 344. In such an embodiment, the intake dampers 327 and exhaust dampers 329 are typically closed but may be operated if the heat wheel 242 is unable to transfer all of the heat produced by the computing systems 211, or to periodically renew the air inside the module, or even to evacuate smoke if need be.

Figure 3D:
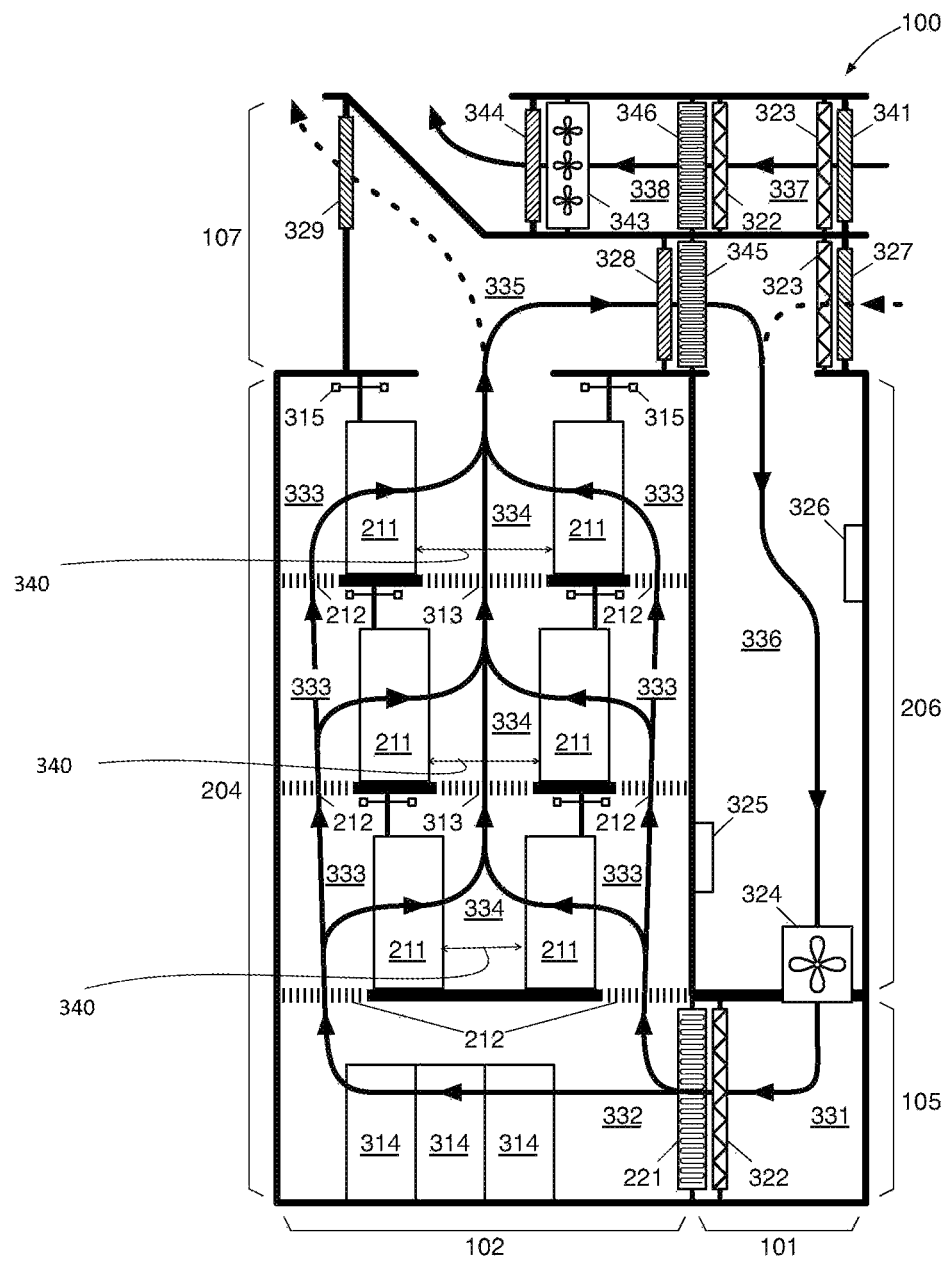
FIG. 3d is a front sectional schematic view of the four-story 2-row embodiment of FIG. 3b, the embodiment using an alternate roof-top air handling unit that comprises an air-to-air heat exchange system based on a thermosiphon.

Now referring to FIG. 3d, another embodiment of a four-story vertical data center module 100 using a thermosiphon as an air-to-air heat exchanger is shown. In such an embodiment, the heat contained in the airflow that circulates from the area 335 to the area 336 is captured by an evaporator 345 of the thermosiphon. The heat is then released by a condenser 346 in the airflow crossing from area 337 to area 338. In such an embodiment, the intake dampers 327 and exhaust dampers 329 are typically in a closed state but may be operated if the thermosiphon 345/346 is unable to transfer all of the heat produced by the computing systems 211, or to periodically renew the air inside the module, or even to evacuate smoke if need be.

Referring to FIGS. 3a-3d, the hot air circulates in the hot aisle 334. Apertures 212 and 313 allow air to circulate from one level from another. Now referring to FIG. 3a, the area of each aperture 212 decreases from a level to an upper level while the area of each aperture 313 is expanding from a level to an upper level. Now referring to FIGS. 3b to 3d, the area of each aperture 212 or 313 are expanding from a level to an upper level. Such configurations allow efficient upward circulation of cold air and of the resulting air warmth by passage through the computer systems 211.

Figure 4:
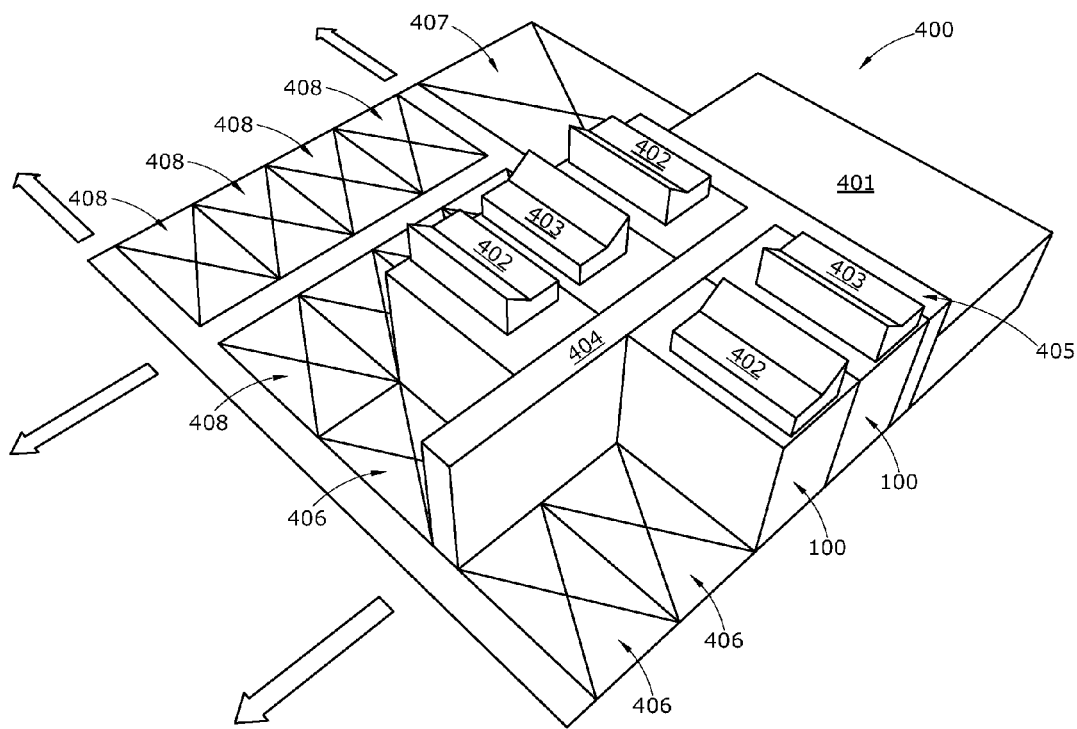
FIG. 4 presents a perspective view of an embodiment of a large-scale vertical data center complex, in accordance with the principles of the present invention.

Referring now to FIG. 4, an exemplary embodiment of a large-scale vertical data center complex 400 is shown. The complex 400 comprises at least one central facility building 401 connected to a cluster of vertical data center modules 100 or units. In such an embodiment, a cluster of eight possible units comprising five pre-built vertical data center modules 100, and three optional expansion slots 406 for receiving three additional units. The central facility 401 hosts the services shared between the deployed modules 100, such as, but not limited to, low or medium voltage power feeds, chilled-water feeds, demineralized water for humidity control, Internet connections, security check points with biometric access controls, washrooms, meeting rooms, etc. Understandably, one skilled in the art shall understand that the cluster may comprise any number of data center modules 100 and of expansion slots 406. Such modules and/or expansion slots may be disposed and/or configured based on the needs of a specific usage.

The data center complex 400 may comprise two or more types of vertical data center modules. Typically, a first type of module 402 comprises a first area 101 disposed on the right side of the second area 102 (as illustrated by FIGS. 1, 2 and 3). A second type of module 403 is a mirror from the first type of module 402 as the first area 101 is disposed on the left side of the second area 102. These two types of module may be alternated in a vertical data center complex 400 so that the exhaust vent 329 (FIG. 3a or 3b) or 344 (FIG. 3c or 3d) of one module does not feed wasted or exiting air into the intake vent 327 (FIG. 3a or 3b) or 341 (FIG. 3c or 3d) of a neighbor module.

In an embodiment, multi-level corridors 404 and 405 may link the central facility 401 to the vertical data center modules 402 and 403. In such an embodiment, the lower level corridors provide human access to the lower level of the modules 402 or 403, while the upper level corridors are used for accessing the upper computing levels 206 (see FIG. 2). All water feeds are typically carried under the lower level corridors, and all power feeds are typically carried in false ceiling of the same corridors. As such, the effects of a water pipe fracture are potentially minimized. All communication network feeds are typically routed in the false ceilings of the upper level corridors.

A vertical data center module 402 or 403 of a complex 400 typically comprises a weatherproof prefabricated weight bearing exterior shell or envelope designed to be shared with one or more adjacent modules. In other words, in the present embodiment, two adjacent modules 402 and 403 shall share a wall, thereby reducing costs and footprint. Still, in other embodiments, each vertical data center module 402 or 403 may have its own independent weight bearing walls. The corridors 404 and 405 also share this modular wall structure so that a large-scale vertical data center complex 400 can be rapidly and efficiently assembled one module at a time.

Still referring to FIG. 4, a vertical module-based data center complex 400 may be assembled on-demand, one or more modules 402 or 403 at a time, after having built a corridor section 404. Not shown are the emergency exits that are typically located at the end of corridors 404 or 405.

The topology or configuration of the vertical data center complex 400 is not limited to the example shown in FIG. 4. In general, clustered modules 402 and 403 are juxtaposed on each side of at least one main corridor 404, with possible orthogonal secondary corridors 405. The central facility is typically expanded in one direction using an adjacent lot 407, while new modules are added in a perpendicular direction. However, any other topology can be used to accommodate different shapes of land.

Figure 5:
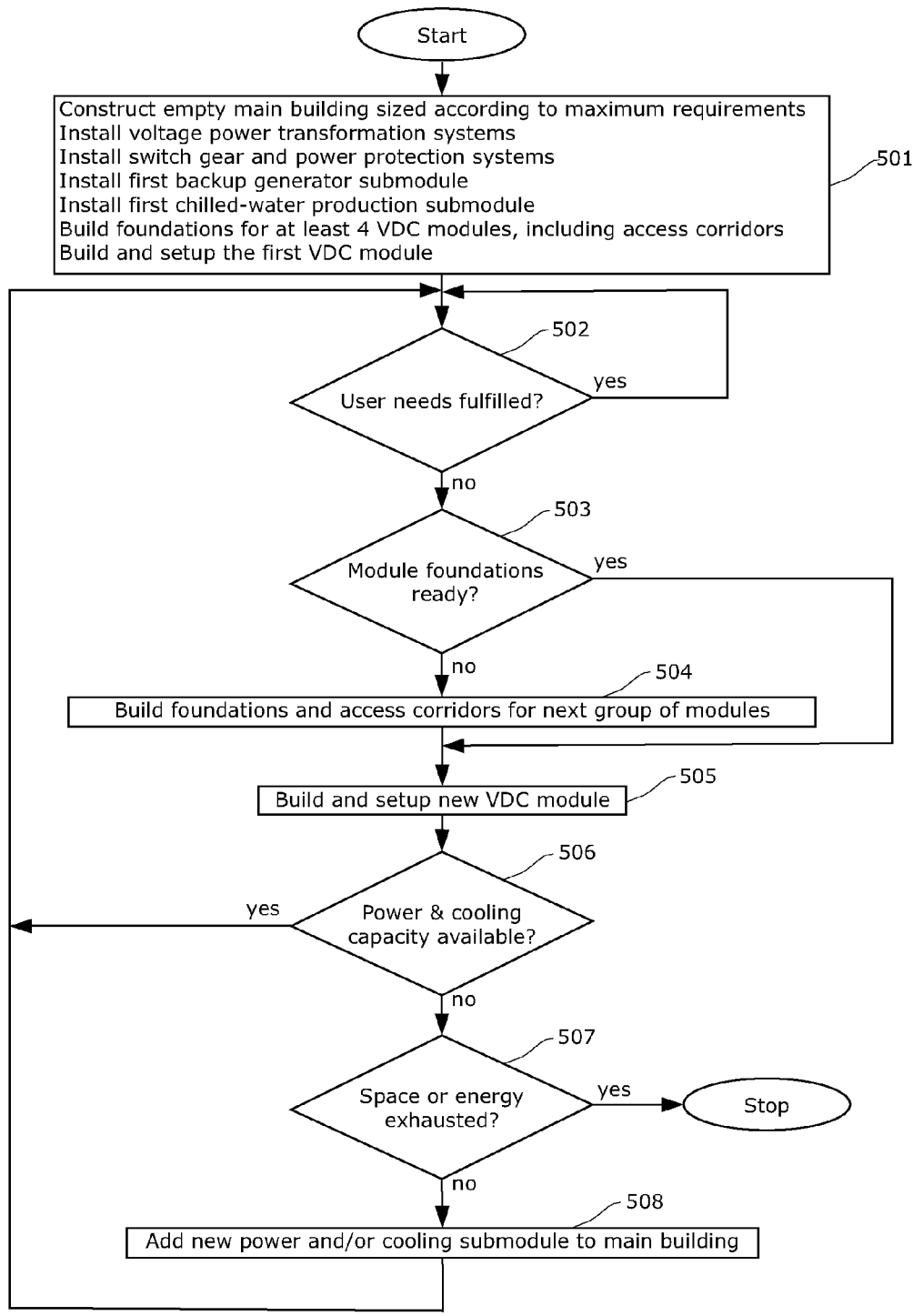
FIG. 5 is a flowchart that illustrates an exemplary method for deploying large scale data center module complexes in accordance with the principles of the present invention.

Referring to FIG. 5, the deployment method for a large-scale data center complex 400 is described by a flowchart. The method bootstraps (at 501) by constructing the central facility building 401 for housing the main power and cooling infrastructures that are shared by all modules 100. This initial facility 401 is essentially an empty shell built on a concrete slab. It has some office space for administration, security, and maintenance staff, but most of its footprint is typically of low cost warehouse type. It must generally be sized according to the expected maximum power capacity of the cluster of vertical data center modules that it should serve. Then, the corresponding medium or high voltage power feeds from the utility company must be installed with adequate voltage transformation, switchgears, and protection systems. If possible, this step shall be phased to minimize initial investments. The important thing is to have enough switchgear to make sure that additional power capacity can be added without having to interrupt services to existing modules 100. Backup generators and chillers modules should generally be installed one by one, as user needs evolve, maximizing ROI. Building vertical data center modules 100 requires a concrete slab with strong foundations because of the weight of the computing systems and other machinery. As building these foundations may take a somewhat long lead time, especially for locations where the ground freezes during winter, it may be wise to anticipate user needs and build them well in advance for at least several (e.g. 4) modules 100, including access corridors and passageways 404 and 405. Obviously, this number can be increased if rapidly changing user needs are expected. The last step of this initial work is to build and setup the first module 100 to address the initial user needs. Again, if these needs are initially greater, the number of initial modules 100 should be augmented accordingly.

Afterward, user needs are constantly assessed (at 502) and if no longer fulfilled, a new module 100 is ordered, factory built and assembled on existing foundations (at 505). If no foundations are available (at 503), or if not enough of them are currently available to address the expected short term needs, then new foundations are built in increments of typically 4 or more (at 504). If medium voltage power or cooling capacity is short in the central facility 100 (at 506), but space and energy is still available (at 507), then new power and/or cooling modules are added to the central facility 401 (at 508). Otherwise, if power and cooling capacity for the new modules 100 is short and space or energy is exhausted, then the current cluster has reached its capacity and a new cluster should be built on adjacent lots 407 and 408.

Figure 6A:
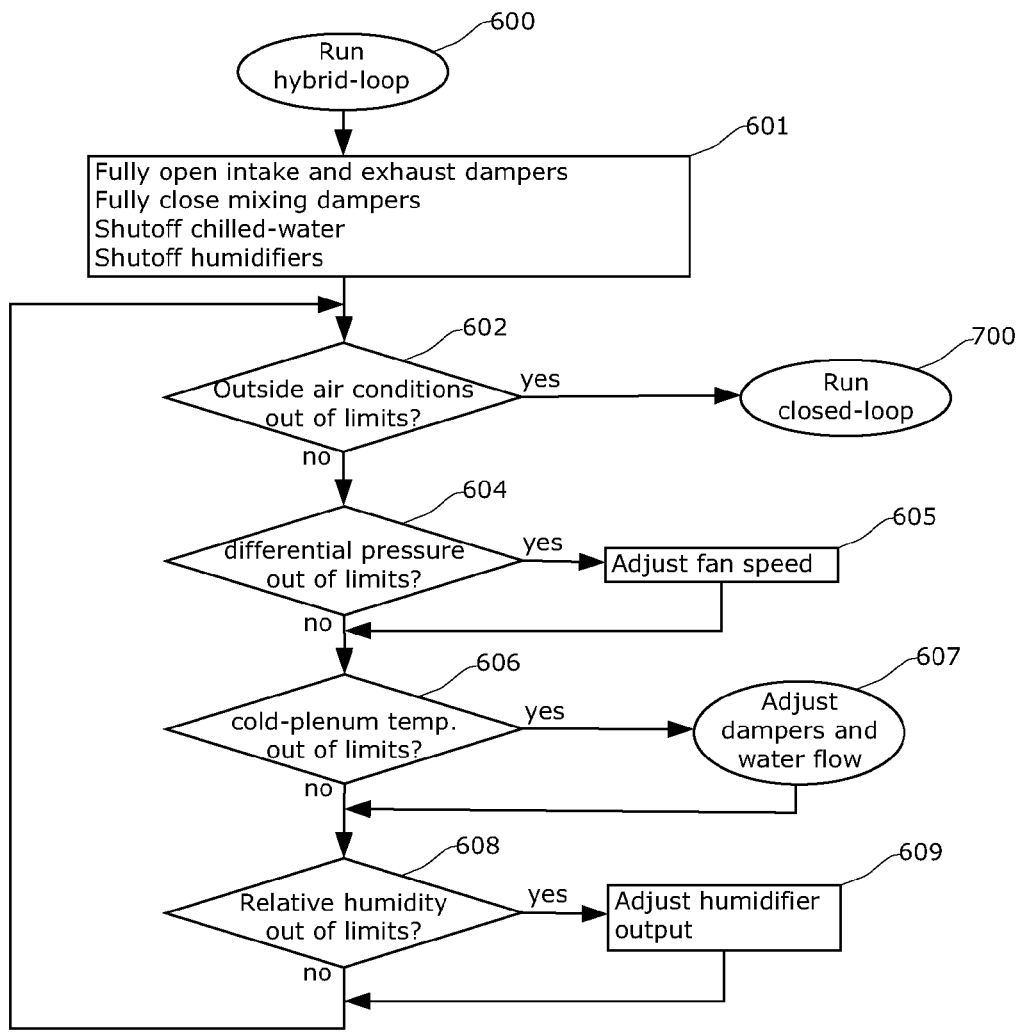
FIGS. 6a and 6b are flowcharts that illustrate an exemplary all-season hybrid-loop control method for the cooling system of the data center module in accordance with the principles of the present invention.

Referring to FIG. 6a, the hybrid-loop control method 600 for cooling a vertical data center module 100 is described with the help of a flowchart. This method 600 applies independently for each of the two cooling subsystems in the module 100. The method starts (at 601) by initially fully opening the intake and exhaust dampers 327 and 329, and fully closing the mixing dampers 328. The chilled-water valve is also initially closed so that no water is flowing through the coils 221. Also, the humidifiers 326 are also initially shutoff.

Then, the method 600 enters a loop where outside air conditions are first evaluated. If temperature or humidity are out of limits ("yes" branch at 602), then the system may no longer operate in hybrid-loop and is automatically switched to closed-loop operation (see 700 of FIG. 7). Indeed, when the outside temperature reaches the set-point temperature for the central plenum 332, the system can no longer operate in hybrid-loop in any practical way, so it reverts to closed loop operations. The decision can be implemented using either the outside dry bulb temperature or the more precise air enthalpy. If the outside conditions are favorable ("no" branch at 602), then the process continues by measuring the differential pressure on all levels 206, between the cold and hot aisles 333 and 334, using the differential pressure sensors 315. The lowest measurement is kept and used to adjust the fan speed (at 605) if the pressure is determined to be out of limits ("yes" branch at 604). The acceptable range of differential pressure is between two small positive values. In the case where the central plenum 332 is maintained at temperatures below 20 degrees Celsius, the lower end of this range should be approximately zero; if the central plenum 332 is operated at higher temperature, it may need to be somewhat above zero to maintain a more aggressive minimum differential pressure. The fan speed adjustment method uses standard control algorithms for this purpose.

The next step is to regulate the temperature of the cold-aisles 333 if it is outside of the preset limits (at 606). The temperature is measured at the output of the cooling subsystem in the central plenum 332. Four variables can be controlled to achieve temperature regulation: the flow of water in the coils 221, and the flow of air in the intake, exhaust, and mixing dampers 327, 329 and 328 respectively (at 607).

Figure 6B:
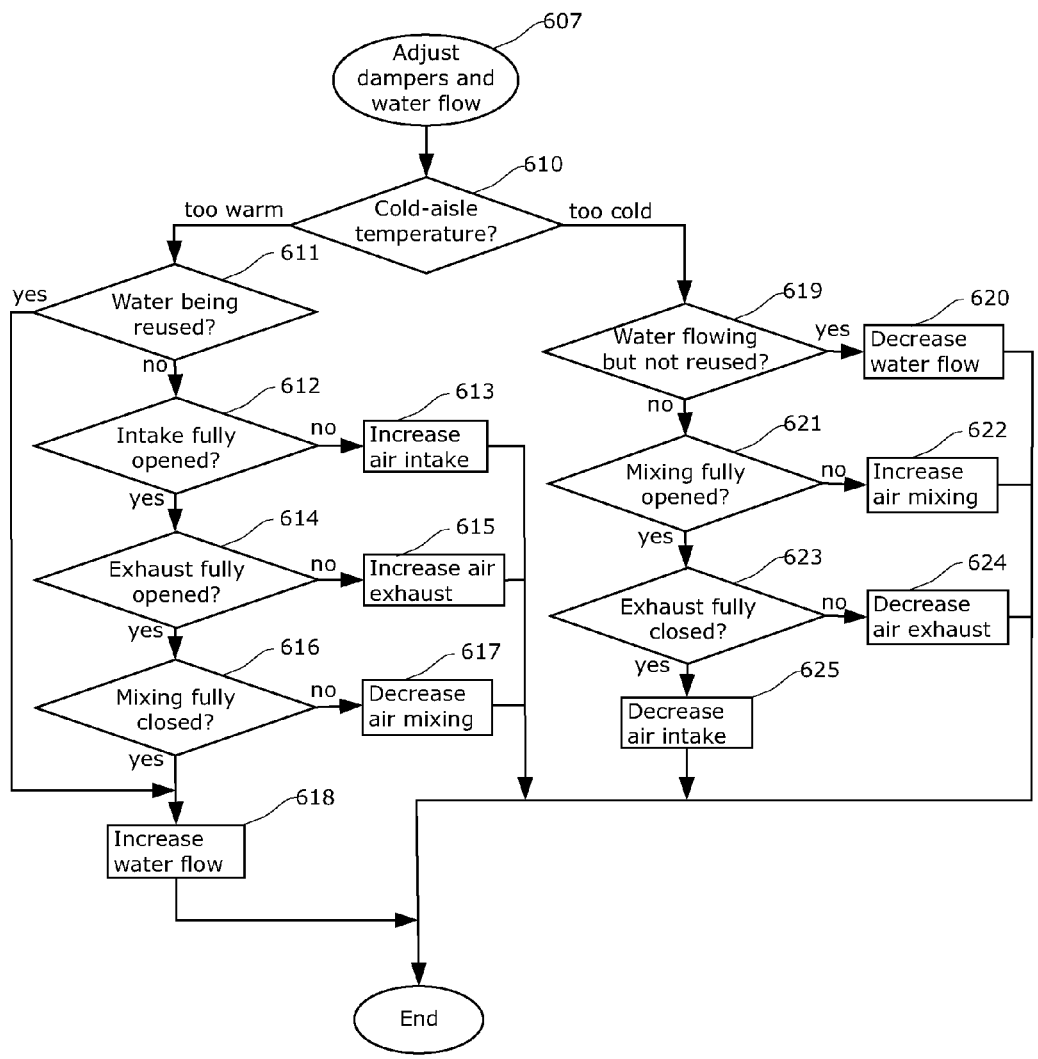

Referring to FIG. 6b, the method performed at 607 for adjusting the dampers and water flow is illustrated with a flowchart. When the central plenum 332 temperature is too cold ("too cold" branch at 610), the method uses a strategy that prioritizes the variables in the following order: water flow, mixing airflow, exhaust airflow, and intake airflow. If water is currently flowing, but not being reused by the central facility 401 ("yes" branch at 619), then its flow is decreased (620) to maximize the use of the air-side economizer cycle (which is the general objective of the hybrid-loop operation). Otherwise ("no" branch at 619), either no water is flowing, in which case flow cannot be reduced, or water is flowing, but needed by the central facility 401 for useful energy reuse. At this point, some warm air from the exhaust plenum 335 must be recirculated to further preheat the air in the mixing plenum 336. If the mixing dampers 328 are not yet fully opened ("no" branch at 621), then it is opened some more to increase air mixing (at 622). In this way, more of the warm air in the exhaust plenum 335 is mixed with the external cold air to raise the air temperature of the input plenum 331. On the contrary, if the mixing dampers 328 are already fully opened ("yes" branch at 621), then it is necessary to act on the exhaust dampers 329 by decreasing the flow of air that can exit the module 100 (at 624). In this way, more of the exhaust plenum air can mix with the outside air to raise the temperature in the input plenum 331. In the extreme case, the exhaust dampers 329 are fully closed ("yes" branch at 623) and all of the warm hot-aisle 334 air is recirculated. When this happens, there is a possibility that some of this warm air under pressure will exit through the intake vent 327 instead of being sucked downward in the mixing plenum 336, so the intake damper 327 cross-section needs to be decreased (at 625) to create a restriction that will force all of the mixed air to flow downwards. It is not possible that the intake dampers 327 fully close unless no heat is dissipated by the computing machinery.

If the central plenum 332 temperature is too warm ("too warm" branch at 610), then the strategy is to prioritize the control variables in the reverse order: intake airflow, exhaust airflow, mixing airflow, and water flow, assuming that water is currently not being reused by the central facility ("no" branch at 611). If the intake dampers 327 are not fully opened ("no" branch at 612), then they should be opened some more to increased the intake airflow (at 613) and allow the possibility for more cold air to enter. Otherwise, they are already fully opened ("yes" branch at 612) and it is the exhaust dampers 329 that need to be opened to allow increased air exhaust (at 615) and, thus, increased air exchange with the outside. Otherwise, both intake and exhaust dampers 327 and 329 are fully opened, and it is the mixer dampers 328 that need to be closed some more if it is not already fully closed ("no" branch at 616), to decrease air mixing (at 617) and reduce the warming of the outside air. Otherwise, if the mixing dampers 328 are fully opened ("yes" branch at 616), or if the water is currently being reused by the central facility 401 ("yes" branch at 611), then the coils 221 need to absorb more heat by increasing their water flow (at 618).

Back to FIG. 6a, the next step is adjusting the humidifier output (at 609) if the relative humidity in the central plenum 332 is out of limits ("yes" branch at 608) for normal operations of the computing systems, as specified by the computer manufacturers. The method for making this adjustment again uses standard algorithms. After this step, the process starts over by checking repeatedly outside air conditions, differential pressure, cold air plenum temperature, and humidity, and by making adjustments, whenever necessary.

The humidifiers increase relative humidity, essentially when the outside air temperature is very cold, and thus too dry once it has been warmed to its set-point temperature. For this purpose, the humidifiers 326 vaporize demineralized water using an efficient adiabatic mechanism. During the summer time, the relative humidity inside the module 100 can also become too high if the outside air is too humid. In those cases, however, the system will tend to switch to closed-loop operations, because the air enthalpy probably makes the air-side economizer cycle counterproductive. In any case, the condensation created by the cooling coils 221 tends to remove the excessive humidity.

Figure 7:
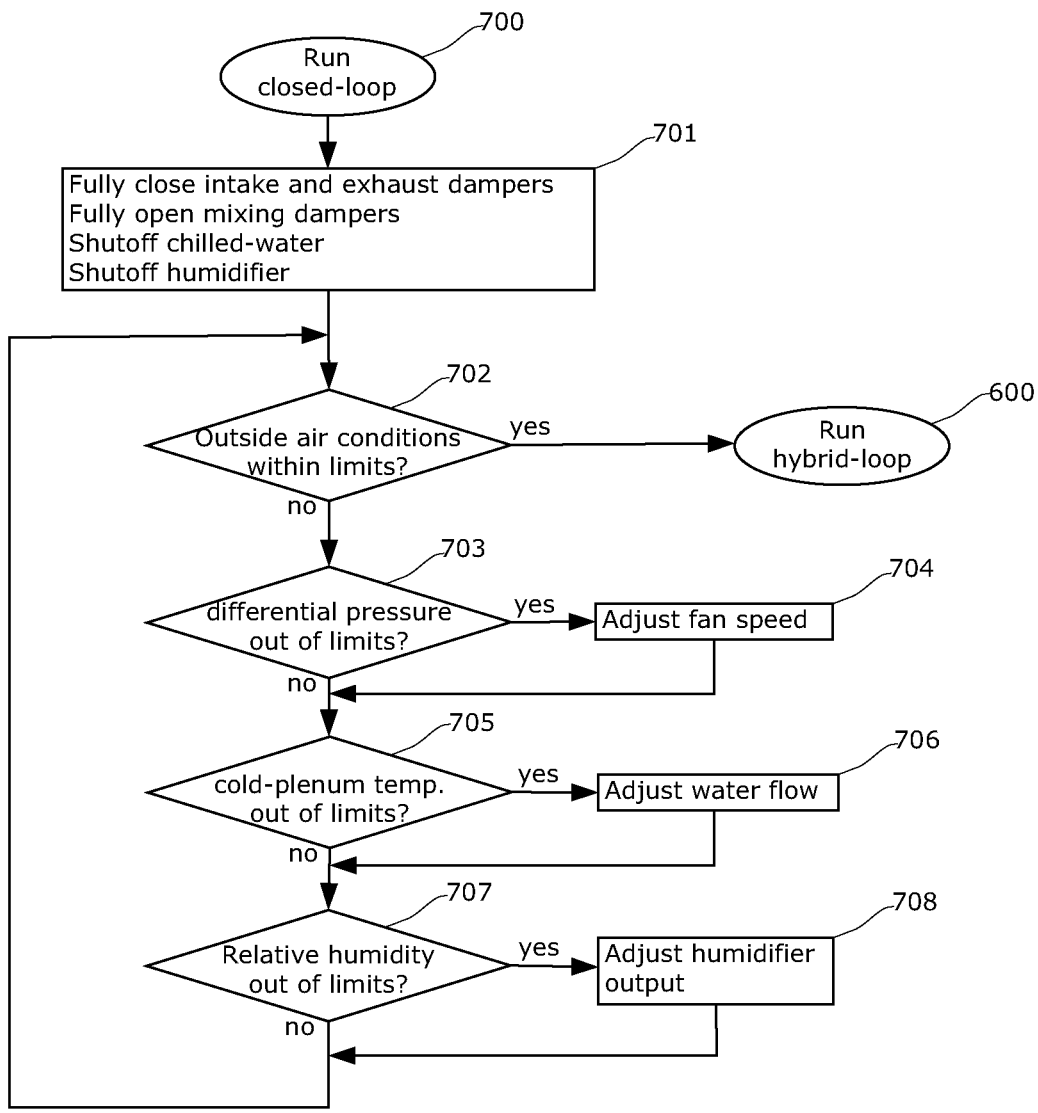
FIG. 7 is a flowchart that illustrates an exemplary closed-loop control method for the cooling system of the vertical data center module, in accordance with the principles of the present invention, when the outside air condition do not permit the efficient use of an air-side economizer cycle.

Referring to FIG. 7, the closed-loop control method 700 for cooling the module 100 is described with the help of a flowchart. The closed-loop method 700 is similar to the hybrid-loop one, but simpler because the temperature regulation has a single variable to work with: the flow of chilled-water in the coils 221. The method 700 starts by fully closing the intake and exhaust dampers 327 and 329, and fully opening the mixing dampers 328 so that all the air in the exhaust plenum 335 is recirculating into the input plenum 331. The chilled-water valve is also initially closed so that no water is flowing through the coils 221, and the humidifiers 326 are shutoff.

Then, the method enters a loop where outside air conditions are first evaluated. If temperature and humidity are within limits ("yes" branch at 702), then the system can switch back to hybrid-loop operations using the air-side economizer cycle. It should be noted here that the outside condition limits for switching from closed-loop to hybrid-loop are not necessarily the same as the one for switching from hybrid-loop to closed-loop. Some hysteresis should be used so that the system does not oscillate between the two modes of operation. If outside conditions are unfavorable ("no" branch at 702), then the method continues by measuring the differential pressure on all floors, between the cold and hot aisles 333 and 334, on both sides of the cabinet rows 211, using the differential pressure sensors 315. The lowest measurement is kept and used to adjust the fan speed (at 704) if the differential pressure is determined to be out of limits ("yes" branch at 703). The acceptable range of differential pressure is between two small positive values. In the case where the central plenum 332 is maintained at temperatures below 20 degrees Celsius, the lower end of this range should be approximately zero; if the central plenum 332 is operated at higher temperature, it may need to be somewhat above zero to maintain a more aggressive minimum differential pressure. The speed adjustment method uses standard control algorithms for this purpose.

The next step is to regulate the temperature of the central plenum 332 by controlling the flow of water in the coils 221. The temperature is measured at the output of the cooling subsystem in the central plenum 332. When the current temperature is out of limits ("yes" branch at 705), the method simply adjusts the water flow (at 706) in the coils 221 using standard control algorithms for this purpose.

The final step is adjusting the humidifier output (at 708) if the relative humidity in the central plenum 332 is out of limit ("yes" branch at 707) for normal operations of servers, as specified by the computer manufacturers. The method for making this adjustment again uses standard control algorithms. After this step, the process starts over by checking repeatedly outside air conditions, differential pressure, temperature, and humidity, and by making adjustments, whenever necessary.

While illustrative and presently preferred embodiments of the invention have been described in detail herein above, it is to be understood that the inventive concepts may be otherwise variously embodied and employed and that the appended claims are intended to be construed to include such variations except insofar as limited by the prior art.

The invention claimed is:

1. A vertical data center (VDC) module, the VDC module comprising an outer envelope and a plurality of levels, the plurality of levels being superimposed one over the other and comprising a bottom level and at least two upper levels, the bottom level comprising a mechanical system and an electrical system, the at least two upper levels each comprising a plurality of computing systems, the plurality of levels being in fluid communication thereby allowing downward and upward movements of air within the VDC module, the VDC module comprising an air handling unit, the air handling unit being in fluid communication with the at least two upper levels, the VDC module further comprising an air-to-air heat exchanger in fluid communication with outside air and the air handling unit, wherein each of the plurality of levels is partitioned into a first area and a second area;
the first area of each of the plurality of levels are in fluid communication to allow downward movements of the air within the VDC module, and wherein the second area of each of the plurality of levels are in fluid communication to allow the upward movements of the air within the VDC module;
the first area and the second area of the bottom level are in fluid communication to allow the air moving downwardly into the first area to transfer into the second area;
the computing systems are located in the second area of each of the at least two upper levels;
the computing systems are arranged in at least one row, and wherein the at least one row defines at least two aisles;
the at least two aisles comprise:
at least one cold aisle located on one side of the at least one row of computing systems, the at least one cold aisle carrying cooling air toward the computing systems, the at least one cold aisle being in direct fluid communication with the at least one cold aisle of at least one adjacent level of the at least two upper levels to upwardly move the air between levels; and
at least one hot aisle located on another side of the at least one row of computing systems, the at least one hot aisle upwardly carrying warmed air flowing out of the computing systems, the at least one hot aisle being in direct fluid communication with the at least one hot aisle of the at least one adjacent level of the at least two upper levels to upwardly move the air between levels, the at least one hot aisle has an increasing cross-section when going up from a lowest one of the at least two upper levels to a highest one of the at least two upper levels; and;
the air-to-air heat exchanger extracts at least part of heat contained in the warmed air flowing out of the computing systems.

2. The VDC module as claimed in claim 1, further comprises at least one set of cooling coils located between the first area and the second area of one or more of the a plurality of levels and through which the air can flow.

3. The VDC module as claimed in claim 2, further comprises at least one valve per set of cooling coils controlling a volume of chilled water received by each of the at least one set of the cooling coils.

4. The VDC module as claimed in claim 2, further comprises sensors for measuring temperature of the air on both sides of each of the at least one set of the cooling coils and for measuring water temperature at a water input and a water output of each of the at least one set of the cooling coils.

5. The VDC module as claimed in claim 1, further comprises a plurality of blowers inside the first area of one or more levels of the plurality of levels.

6. The VDC module as claimed in claim 5, further comprises variable drives for controlling speed of the blowers.

7. The VDC module as claimed in claim 6, further comprises sensors for measuring the velocity of the blowers.

8. The VDC module as claimed in claim 5, further comprises an embedded controller and a plurality of actuators, the embedded controller being configured to automatically adjust the actuators to regulate temperature and humidity according to predetermined values and data of at least one sensor of the VDC module.

9. The VDC module as claimed in claim 8, wherein the actuators are configured to open at least one valve letting water flows inside at least one set of cooling coils.

10. The VDC module as claimed in claim 8, wherein the actuators are configured to control speed of the blowers.

11. The VDC module as claimed in claim 8, wherein the actuators are configured to control opening and closing of dampers in the air handling unit.

12. The VDC module as claimed in claim 8, wherein the at least one sensor of the VDC measures humidity, temperature and pressure.

13. The VDC module as claimed in claim 1, further comprises a plurality of sensors for measuring differential pressures between the at least one cold-aisle and the at least one hot-aisle of each of the second area of the at least two upper levels of the VDC module.

14. The VDC module as claimed in claim 1, further comprises at least one internal relative humidity sensor and at least one internal temperature sensor within the at least one cold aisle of at least one of the at least two upper levels, and at least one external relative humidity sensor and at least one external temperature sensor outside of the VDC module.

15. The VDC module as claimed in claim 14, wherein the at least one internal temperature sensor is a first plurality of internal temperature sensors in the second area of each of the plurality of levels, and the VDC module further comprises a second plurality of temperature sensors in the first area on each of the plurality of levels.

16. The VDC module as claimed in claim 1, further comprises a busway based power distribution system connected to the computing systems, having at least one separate busway for each of the at least one row of the computing systems.

17. The VDC module as claimed in claim 16, further comprises sensors for measuring the busway voltage and the busway amperage.

18. The VDC module as claimed in claim 1, wherein the computing systems are disposed in a plurality of cabinets forming each of the at least one row of the computing systems.

19. The VDC module as claimed in claim 18, further comprises a busway based power distribution system connected to the cabinets of the computing systems and wherein at least one distinct busway is connected to each of the at least one row of the computing systems disposed in the cabinets.

20. The VDC module as claimed in claim 1, wherein the at least one hot aisle of the highest one of the at least two upper levels is in fluid communication with the air handling unit to allow the air moving upwardly from the second area of the highest one of the at least two upper levels to transfer downwardly into its first area.

21. The VDC module as claimed in claim 20, wherein the air handling unit comprises at least one intake vent having motorized dampers for controlling the amount of the outside air from outside entering the VDC module, at least one exhaust vent having motorized dampers for controlling the amount of the air from inside exiting the VDC module, and at least one vent having motorized dampers for controlling the amount of the air moving upwardly within the module to be recirculated with the air moving downwardly within the VDC module.

22. The VDC module as claimed in claim 21, further comprises sensors inside the air handling unit for measuring opening of the intake, exhaust, and mixing dampers.

23. The VDC module as claimed in claim 22, wherein the air-to-air heat exchanger comprises at least one heat wheel.

24. The VDC module as claimed in claim 22, wherein the air-to-air heat exchanger comprises at least one thermosiphon.

25. The VDC module as claimed in claim 1, further comprises an embedded monitoring system configured to log and displays information on status of the VDC module.

26. The VDC module as claimed in claim 25, wherein the the status is a real-time status of the VDC module.

27. The VDC module as claimed in claim 25, wherein the the status is a historical status of the VDC module.

28. The VDC module as claimed in claim 25, wherein the information comprises an overall power usage and energy reuse effectiveness.

29. The VDC module as claimed in claim 25, wherein the embedded monitoring system displays the information using a web-based interface.

30. A vertical data center (VDC) complex comprises a central facility and at least one vertical data center (VDC) module in communication with the central facility, wherein the at least one VDC comprises an outer envelope and a plurality of levels, the plurality of levels being superimposed one over the other and comprising a bottom level and at least two upper levels, the bottom level comprising a mechanical system and an electrical system, the at least two upper levels each comprising a plurality of computing systems, the plurality of levels being in fluid communication thereby allowing downward and upward movements of air within the at least one VDC module, the at least one VDC module comprising an air handling unit, the air handling unit being in fluid communication with the at least two upper levels, the at least one VDC module further comprising an air-to-air heat exchanger in fluid communication with outside air and the air handling unit, wherein each of the plurality of levels is partitioned into a first area and a second area;
the first area of each of the plurality of levels are in fluid communication to allow downward movements of the air within the VDC module, and wherein the second area of each of the plurality of levels are in fluid communication to allow the upward movements of the air within the VDC module;
the first area and the second area of the bottom level are in fluid communication to allow the air moving downwardly into the first area to transfer into the second area;
the computing systems are located in the second area of each of the at least two upper levels;
the computing systems are arranged in at least one row, and wherein the at least one row defines at least two aisles;
the at least two aisles comprise:
at least one cold aisle located on one side of the at least one row of computing systems, the at least one cold aisle carrying cooling air toward the computing systems, the at least one cold aisle being in direct fluid communication with the at least one cold aisle of at least one adjacent level of the at least two upper levels to upwardly move the air between levels; and
the at least two aisles comprise at least one hot aisle located on another side of the at least one row of computing systems, the at least one hot aisle upwardly carrying warmed air flowing out of the computing systems, the at least one hot aisle being in direct fluid communication with the at least one hot aisle of the at least one adjacent level of the at least two upper levels to upwardly move the air between levels, the at least one hot aisle has an increasing cross-section when going up from a lowest one of the at least two upper levels to a highest one of the at least two upper levels; and
the air-to-air heat exchanger extracts at least part of heat contained in the warmed air flowing out of the computing systems.

31. The VDC complex as claimed in claim 30, wherein the VDC complex and the at least one VDC module are in communication through a network of multilevel access corridors.

32. The VDC complex as claimed in claim 30, wherein each of the at least one VDC module comprises a module controller and wherein the VDC complex comprises an embedded controller configured to interact with the module controller of each of the at least one VDC module to optimize an overall energy efficiency of the VDC complex.

33. The VDC complex as claimed in claim 32, further comprises an embedded monitoring system configured to log and displays information on status of the at least one VDC module.

34. The VDC complex as claimed in claim 33, wherein the the status is a real-time status of the VDC module.

35. The VDC complex as claimed in claim 33, wherein the the status is a historical status of the at least one VDC module.

36. The VDC complex as claimed in claim 33, wherein the information comprises an overall power usage and energy reuse effectiveness.

37. The VDC complex as claimed in claim 33, wherein the embedded monitoring system displays the information using a web-based interface.

38. A method to deploy a data center complex comprising a central facility and at least one vertical data center (VDC) module, wherein the at least one VDC module comprises an outer envelope and a plurality of levels, the plurality of levels being superimposed one over the other and comprising a bottom level and at least two upper levels, the bottom level comprising a mechanical system and an electrical system, the at least two upper levels comprising each a plurality of computing systems, the plurality of levels being in fluid communication thereby allowing downward and upward movements of air within the VDC module, the VDC module comprising an air handling unit and an air-to-air heat exchanger, the air handling unit being in fluid communication with the at least two upper levels, wherein
  each of the plurality of levels is partitioned into a first area and a second area;
  the first area of each of the plurality of levels are in fluid communication to allow downward movements of air within the VDC module, and wherein the second area of each of the plurality of levels are in fluid communication to allow the upward movements of the air within the VDC module;
  the first area and the second area of the bottom level are in fluid communication to allow the air moving downwardly into the first area to transfer into the second area;
  the computing systems are located in the second area of each of the at least two upper levels;
  the computing systems are arranged in at least one row, and wherein the at least one row defines at least two aisles;
  the at least two aisles comprise:
    at least one cold aisle located on one side of the at least one row of computing systems, the at least one cold aisle carrying cooling air toward the computing systems, the at least one cold aisle being in direct fluid communication with the at least one cold aisle of at least one adjacent level of the at least two upper levels to upwardly move the air between levels; and
    at least one hot aisle located on another side of the at least one row of computing systems, the at least one hot aisle upwardly carrying warmed air flowing out of the computing systems, the at least one hot aisle being in direct fluid communication with the at least one hot aisle of the at least one adjacent level to upwardly move the air between levels, the at least one hot aisle has an increasing cross-section when going up from a lowest one of the at least two upper levels to a highest one of the at least two upper levels; and;
  the air-to-air heat exchanger being in fluid communication with outside air and the air handling unit, and extracting at least part of heat contained in the warmed air flowing out of the computing systems;
  the method comprising the steps for:
    building the central facility;
    building a foundation for the least one VDC module; and
    building the at least one VDC module on the foundation.

39. The method to deploy the data center complex of claim 38, the method further comprising one of the following steps:
  building at least one another one of the VDC module on-demand;
  building at least one another one of the foundation and access corridors on-demand; and
  building another one of the central facility.

* * * * *